(12) United States Patent
Zhang et al.

(10) Patent No.: US 12,131,914 B2
(45) Date of Patent: Oct. 29, 2024

(54) SELECTIVE ETCHING WITH FLUORINE, OXYGEN AND NOBLE GAS CONTAINING PLASMAS

(71) Applicants: Tokyo Electron Limited, Tokyo (JP); Université d'Orléans, Orléans (FR)

(72) Inventors: Du Zhang, Albany, NY (US); Hojin Kim, Albany, NY (US); Shigeru Tahara, Taiwa-cho (JP); Kaoru Maekawa, Albany, NY (US); Mingmei Wang, Albany, NY (US); Jacques Faguet, Austin, TX (US); Remi Dussart, Orléans (FR); Thomas Tillocher, Orléans (FR); Philippe Lefaucheux, Orléans (FR); Gaëlle Antoun, Orléans (FR)

(73) Assignees: Tokyo Electron Limited, Tokyo (JP); Université d'Orleans, Orléans (FR)

(*) Notice: Subject to any disclaimer, the term of this patent is extended or adjusted under 35 U.S.C. 154(b) by 436 days.

(21) Appl. No.: 17/521,958

(22) Filed: Nov. 9, 2021

(65) Prior Publication Data
US 2022/0199418 A1    Jun. 23, 2022

Related U.S. Application Data

(60) Provisional application No. 63/194,561, filed on May 28, 2021, provisional application No. 63/126,951, filed on Dec. 17, 2020.

(51) Int. Cl.
*H01L 21/311* (2006.01)
*H01L 21/02* (2006.01)

(52) U.S. Cl.
CPC .... *H01L 21/31116* (2013.01); *H01L 21/0212* (2013.01); *H01L 21/02274* (2013.01); *H01L 21/0228* (2013.01)

(58) Field of Classification Search
None
See application file for complete search history.

(56) References Cited

U.S. PATENT DOCUMENTS 2,933,374 A * 4/1960 Cook ............... C01B 33/043
                                                423/347
3,399,222 A * 8/1968 Weyenberg ........ C07F 7/0896
                                                556/469

(Continued)

FOREIGN PATENT DOCUMENTS

WO    2019178030 A1    9/2019
WO    2020223011 A1    11/2020

OTHER PUBLICATIONS

Pankratiev et al., "Selective SiN/SiO2 etching by SF6/H2/Ar/He plasma", AIP Conference Proceedings 2179, 020017 (2019), http://doi.org/10.1063/1.5135490, published Nov. 26, 2019, 5 pages.

(Continued)

*Primary Examiner* — Hsien Ming Lee
(74) *Attorney, Agent, or Firm* — Slater Matsil, LLP

(57) ABSTRACT

A method for processing a substrate that includes: loading the substrate in a plasma processing chamber; performing a cyclic plasma etch process including a plurality of cycles, where each cycle of the plurality of cycles includes: generating a first plasma from a first gas mixture including a fluorosilane and oxygen; performing a deposition step by exposing the substrate to the first plasma to form a passivation film including silicon and fluorine; generating a second plasma from a second gas mixture including a noble gas; and performing an etch step by exposing the substrate to the second plasma.

20 Claims, 13 Drawing Sheets

(56) References Cited

U.S. PATENT DOCUMENTS

| | | |
|---|---|---|
| 8,012,365 B2 | 9/2011 | Dussart et al. |
| 9,627,221 B1 | 4/2017 | Zaitsu |
| 2007/0026677 A1* | 2/2007 | Ji .................. H01L 21/0337 |
| | | 438/689 |
| 2016/0293398 A1 | 10/2016 | Danek |
| 2016/0308112 A1 | 10/2016 | Tan |
| 2017/0076955 A1* | 3/2017 | Hudson ............. H01J 37/32009 |
| 2017/0229314 A1 | 8/2017 | Tan |

OTHER PUBLICATIONS

Pant et al., Etching of Silicon Nitride in CCl2F2, CHF3, SiF4, and SF6 Reactive Plasma: A Comparative"Study", Plasma Chemistry and Plasma Processing vol. 19, No. 4, 1999, Plenum Publishing Compnay, received Jan. 22, 1997, pp. 545-563, total 19 pages.

Reyes-Betanzo et al., "Plasma Etching of Silicon Nitride with High Selectivity over Silicon Oxide and Silicon in Fluorine Containing Plasmas", Vac. Sci. Technol. A 17 (6), 3179 (1999), Center for Semiconductor Components—CCS, UNICAMP, C.P 6061, CEP 13083-970, Campinas, SP, Brazil, 2 pages.

Reyes-Betanzo et al., "Plasma Etching of Si3N4 with High Selectivity Over Si and SiO2", Centro de Componentes Semiconductores—CCS, UNICAMP, C.P. 6061, CEP 13083-970, Campinas, SP, Brasil, 6 pages.

International Search Report and Written Opinion, PCT Application No. PCT/US2021/063387, mailed Apr. 11, 2022, 10 pages.

* cited by examiner

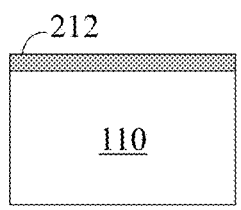 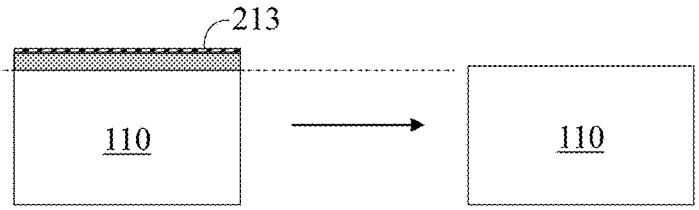
deposition step           etch step
Fig. 2A           Fig. 2B           Fig. 2C
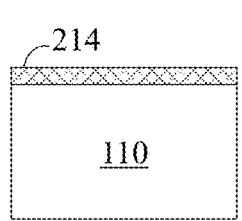 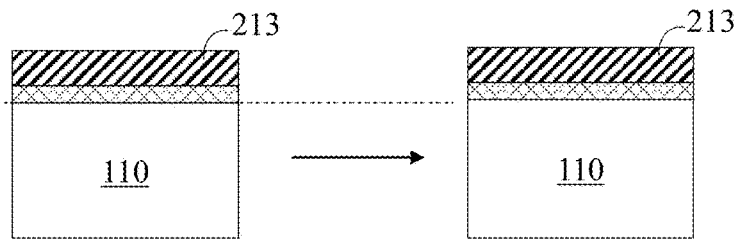
deposition step           etch step
Fig. 2D           Fig. 2E           Fig. 2F
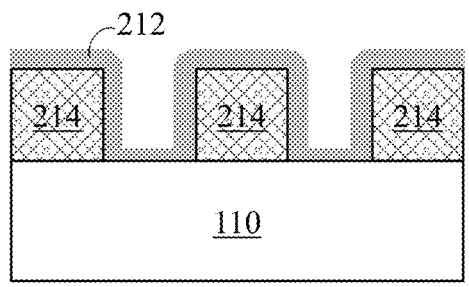 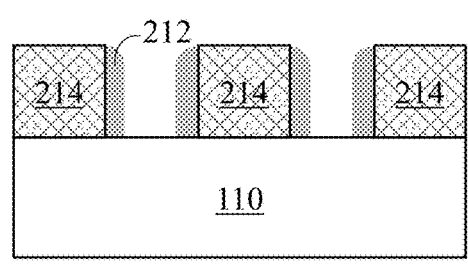
Fig. 2G           Fig. 2H

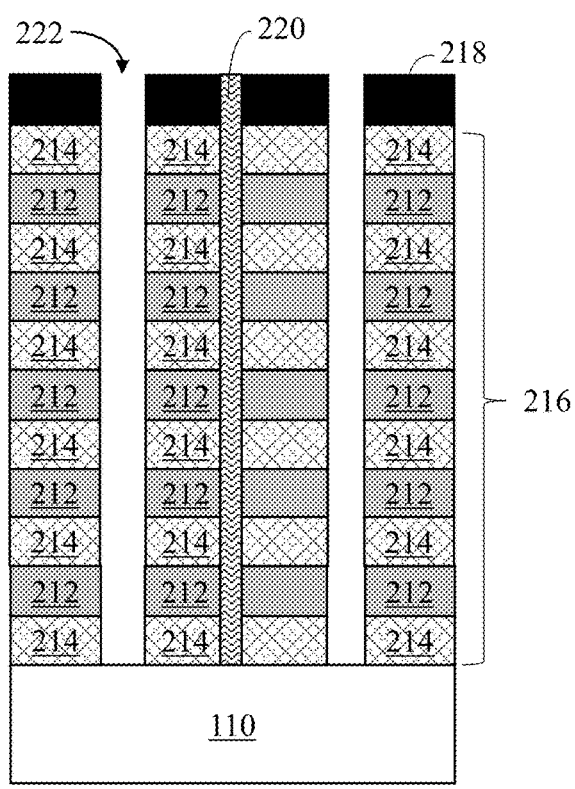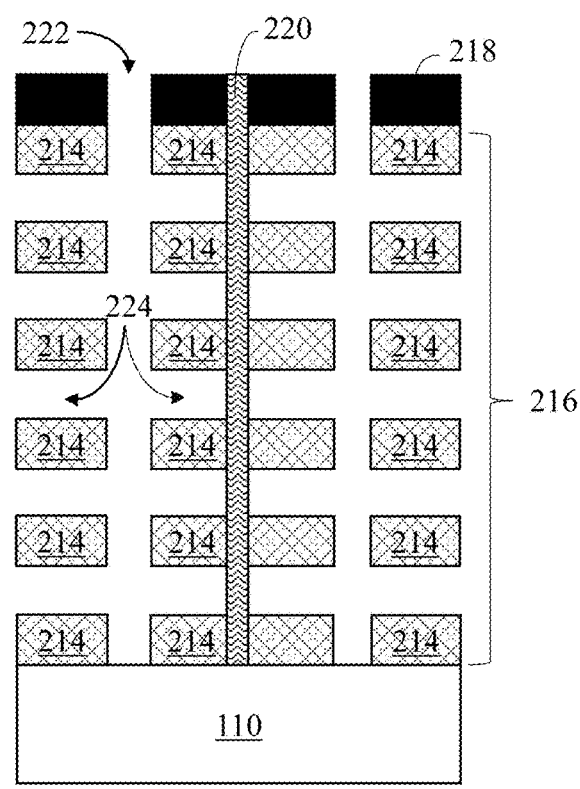
Fig. 2I
Fig. 2J

SELECTIVE ETCHING WITH FLUORINE, OXYGEN AND NOBLE GAS CONTAINING PLASMAS

CROSS-REFERENCE TO RELATED APPLICATIONS

This application claims the benefit of U.S. Provisional Application No. 63/126,951, filed on Dec. 17, 2020 and U.S. Provisional Application No. 63/194,561, filed on May 28, 2021, which applications are hereby incorporated herein by reference.

TECHNICAL FIELD

The present invention relates generally to a system and method of semiconductor fabrication, and, in particular embodiments, to a system and method for selective plasma etching with fluorine, oxygen and argon containing plasma.

BACKGROUND

Generally, the fabrication of semiconductor devices is performed by processes based on lithography, growth of passivation layer, and etching to realize desired structures of target device consisting of layers of dielectric, conductive, and semiconducting components. In the modern semiconductor industry, etching steps rely on reactive ion etching with plasma mainly because of the fast etching rate and directional removal. However, as the size of logic components continues to reduce to sub-10 nm scale with the development of fabrication technology, the required precision in dimensions (e.g., linewidths, etch depth, and film thicknesses) increases and presents challenges to conventional etching methods.

Wet etching is commonly used for obtaining highly selective etching. For example, hot phosphoric acid is used for isotropic removal of silicon nitride with high selectivity relative to silicon dioxide and silicon. However, anisotropic etching has to be used in many applications and therefore wet etching cannot be used.

Against this background, atomic-scale etching control and material selectivity during etching process has become more important in the development of etching technique. Atomic layer etching (ALE) is a new technique that has been researched and under development, and has the advantages in atomic-scale etching ALE removes thin layers of material layer by layer based on sequential, self-limiting reactions. To meet the requirements of the current semiconductor industry for achieving precise thin-layer architectures, however, ALE techniques needs further development to realize anticipated dimension control and film integrity with an atomic precision.

SUMMARY

In accordance with an embodiment of the present invention, a method for processing a substrate that includes: loading the substrate in a plasma processing chamber; performing a cyclic plasma etch process including a plurality of cycles, where each cycle of the plurality of cycles includes: generating a first plasma from a first gas mixture including a fluorosilane and oxygen; performing a deposition step by exposing the substrate to the first plasma to form a passivation film including silicon and fluorine; generating a second plasma from a second gas mixture including a noble gas; and performing an etch step by exposing the substrate to the second plasma.

In accordance with an embodiment of the present invention, a method for processing a substrate that includes: having a substrate including a first region, a second region, and a third region, the first region including a nitride of a first element, the second region including an oxide of the first element, and the third region including an elemental form of the first element; and selectively etching the first region relative to the second and third regions by using a multiple step plasma process in a plasma process chamber, the multiple step plasma process including: while maintaining the substrate at a first temperature, exposing the substrate to a first plasma generated from a first gas mixture including a silane, a fluorine-containing gas, and oxygen, the first temperature being lower or equal to 0° C.; and while maintaining the substrate at a second temperature, exposing the substrate to a second plasma generated from a second gas mixture including a noble gas.

In accordance with an embodiment of the present invention, a method for processing a substrate that includes: having a substrate including a first region, a second region, and a third region, the first region including a nitride of a first element, the second region including an oxide of the first element, and the third region including an elemental form of the first element; and selectively etching the first region relative to the second and third regions by using a plasma process including: while maintaining the substrate at a first temperature, exposing the substrate to a plasma generated from a gas mixture including silicon, fluorine, oxygen, and a noble gas, the first temperature being lower or equal to 0° C.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A-2C illustrate schematic cross-sectional views of a substrate during various steps of a plasma processing in accordance with an embodiment, wherein FIG. 2A illustrates an incoming substrate comprising a layer of nitride, FIG. 2B illustrates after a deposition step, and FIG. 2C illustrates after an etch step where the layer of nitride is removed;

FIGS. 2D-2F illustrate schematic cross-sectional views of a substrate during various steps of a plasma processing in accordance with an alternate embodiment, wherein FIG. 2D illustrates an incoming substrate comprising a layer of oxide, FIG. 2E illustrates after a deposition step, and FIG. 2F illustrates after an etch step where the layer of oxide is preserved;

FIGS. 2G and 2H illustrate schematic cross-sectional views of a substrate before and after an anisotropic plasma processing in accordance with yet another embodiment, wherein FIG. 2G illustrates an incoming substrate comprising a layer of nitride formed over a patterned layer of oxide illustrating an example of spacer etch in self-aligned multiple patterning, and FIG. 2H illustrates after the anisotropic plasma processing that selectively removes lateral sections of nitride;

FIGS. 2I and 2J illustrate schematic cross-sectional views of a substrate at intermediate stages during a process of forming a 3D vertical NAND (VNAND) structure by an isotropic plasma processing in accordance with a further embodiment, wherein FIG. 2I illustrates a substrate comprising a layer stack of oxide layers and nitride layers, and FIG. 2J illustrates after the isotropic plasma processing that selectively removes the nitride;

FIGS. 5A-5C illustrate example thickness variations of three substrates during a cycle of plasma etch process using silicon tetrafluoride and oxygen in the deposition step and argon in the etch step at different process temperatures in accordance with an embodiment, wherein FIG. 5A illustrates the thickness variation of silicon nitride, FIG. 5B illustrates the thickness variation of amorphous silicon, and FIG. 5C illustrates the thickness variation of silicon dioxide;

FIGS. 6A and 6B illustrate the relationship between thickness variation and process temperature of two substrates: silicon nitride and amorphous silicon in accordance with an embodiment, wherein FIG. 6A illustrates a data plot of thickness variation after each step in an example embodiment, and FIG. 6B illustrates a schematic trend of deposition rate on the two substrates as a function of process temperature during a first deposition step;

FIGS. 8A and 8B illustrate oxygen-incorporated surface species on silicon nitride that may form during a first deposition step of a cyclic plasma etch process in accordance with an embodiment, wherein FIG. 8A illustrates an example oxygen consumption by the silicon nitride substrate via $NO_x$ formation and ion-assisted desorption, and FIG. 8B illustrates another example of oxygen consumption via O—H bond formation utilizing NH groups that may be present in the silicon nitride.

DETAILED DESCRIPTION OF ILLUSTRATIVE EMBODIMENTS

Figure 1A:
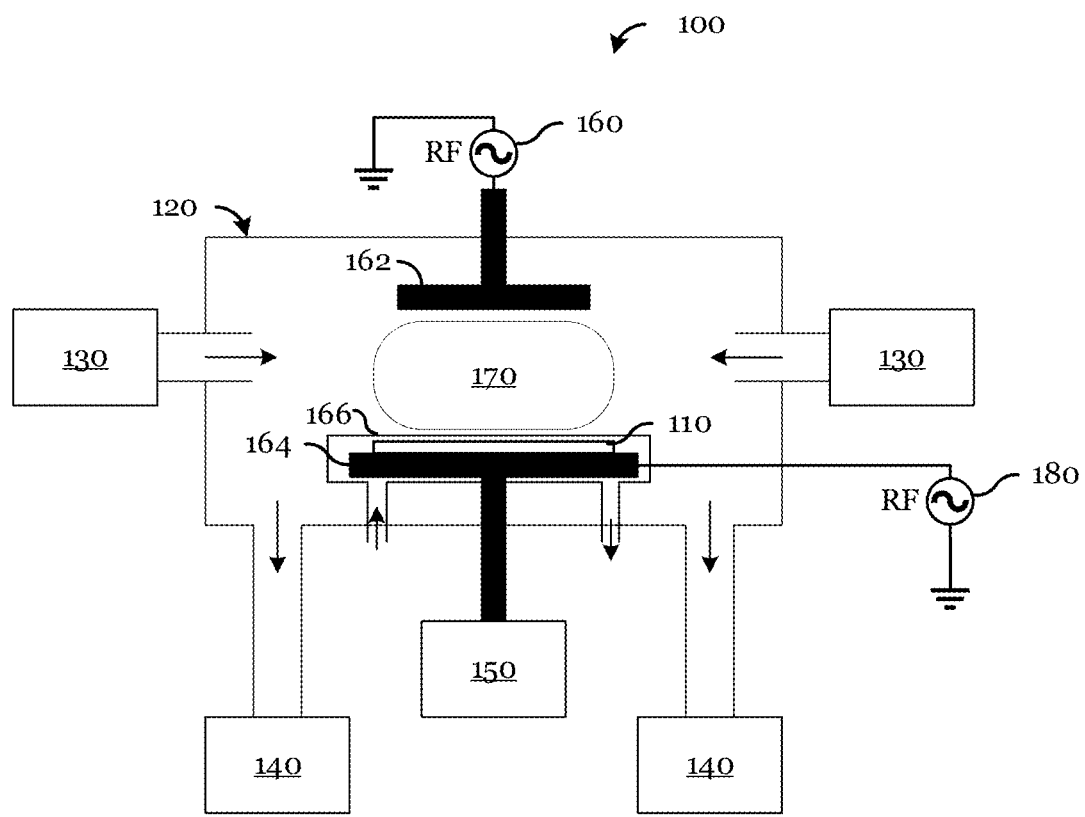
FIG. 1A illustrates a plasma processing tool in accordance with an embodiment of the present application.

Plasma etching techniques play a key role in semiconductor fabrication, and the demand for precise atomic-scale control in etching process has been increasing. Atomic Layer Etching (ALE) is a promising etching technique with the capability to remove materials layer by layer. However, further improvements in figures of merit in etching such as etch rate, selectivity, and anisotropy may be needed for ALE to replace conventional etching techniques.

Many etch applications involve selectively etching one material without removing another material. An example of such an application is the selective removal of silicon nitride ($Si_3N_4$). Silicon nitride is widely used in semiconductor fabrication mainly as a dielectric and mask material. Accordingly, removal of silicon nitride without damaging other components such as silicon (Si) and silicon dioxide ($SiO_2$) has significant industrial relevance. Because multiple surface materials are being exposed to the plasma etching, conventional etch processes use multi-component mixtures such as $CF_4/H_2$, $CF_4/O_2/N_2$, $SF_6/O_2/N_2$, $SF_6/CH_4/N_2$, $SF_6/H_2/Ar/He$, $SF_6/CH_4/N_2/O_2$, and others. Despite such optimization, the selectivity between silicon nitride and silicon may be about 4-6 while the selectivity between silicon nitride and silicon dioxide may be only 1.5-2. However, this may not be sufficient for many applications and increasing the reactivity may damage the device components being formed. Example applications include silicon nitride spacer etch in self-aligned multiple patterning and silicon nitride removal from a O/N/O/N stack (stacked layers of oxide and nitride) after a high aspect ratio contact dielectric etch process, which may be useful in fabricating 3D semiconductor devices, including three-dimensionally-arranged memory cells, such as in 3D vertical NAND (VNAND) memory structures.

Embodiments described in this disclosure provide a quasi-ALE method or a gas-pulsed etching that can be advantageous in selective removal of a certain material over other materials. In various embodiments, the method comprises a set of, or cycles of two plasma treatment steps: deposition step and etch step. The deposition step is to deposit a layer comprising silicon oxyfluoride that functions as a passivation layer during the etch step. One or more plasmas comprising fluorine, oxygen, or a noble gas may be used for these two steps in the embodiment methods. The inventors of this application have identified temperature dependence of deposition rate and composition during a first plasma treatment step for deposition, which can lead to the temperature dependence of etch rate during a second plasma treatment step for etching. These temperature dependences are functions of the type of material being exposed to the plasma. Based on these temperature-dependent characteristics, selective etching of a certain material relative to another material is performed as will be described in more detail below in various embodiments. The embodiment methods may advantageously enable a selective etch process, particularly for nitride materials such as silicon nitride over oxide and/or substrate materials (e.g., silicon oxide and/or silicon). In various embodiments, based on the temperature-dependence of deposition and etch, the selectivity of the embodiment method may be improved by utilizing a low process temperature, for example, lower or equal to 0° C. Further, the deposition step and the etch step may be combined and performed as a single step in certain embodiments. In addition, a hydrogen-containing plasma may also be utilized, separately or together with the etch step, to further improve the overall etch performance including selectivity.

Figure 3A:
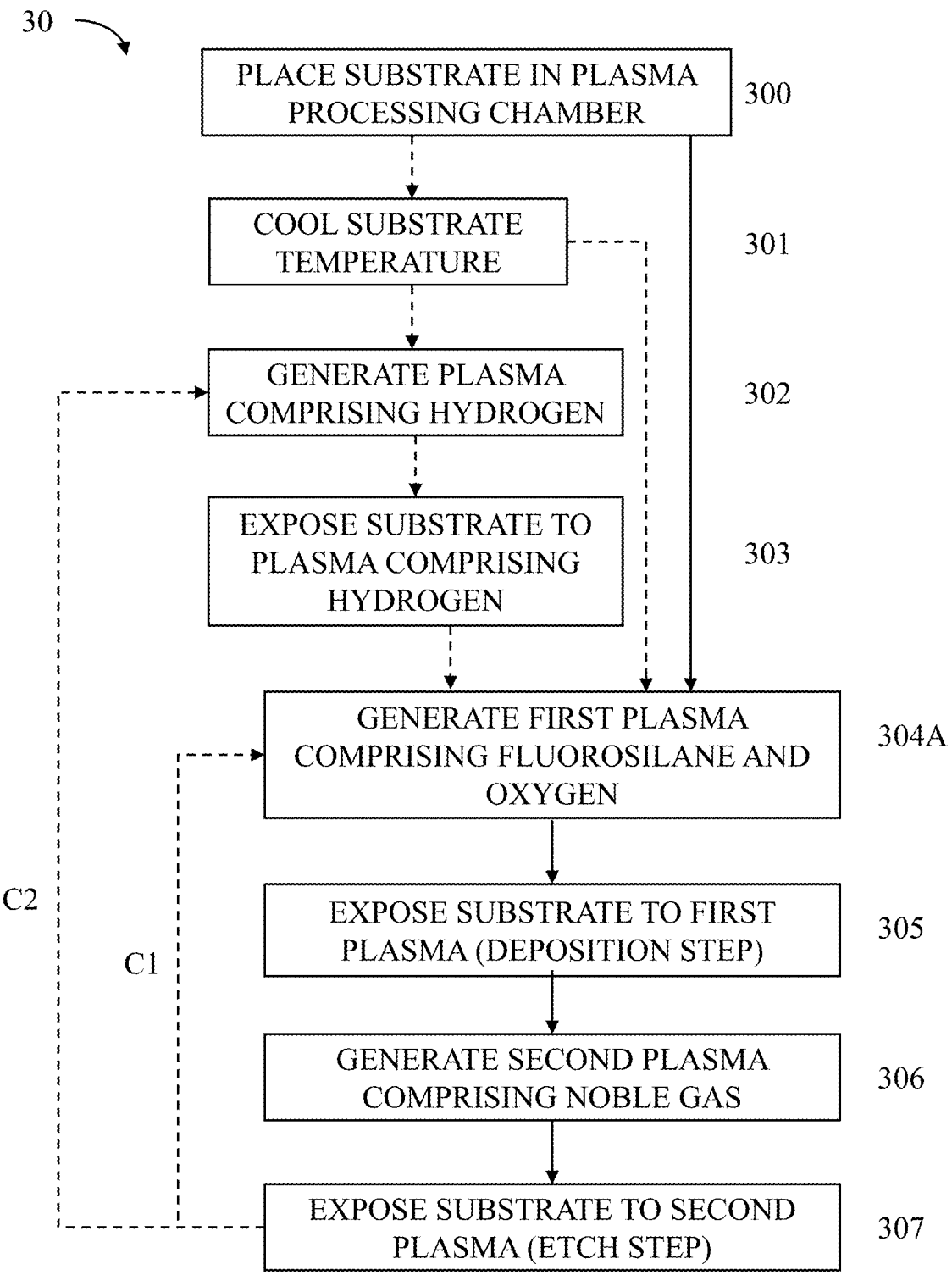
FIG. 3A illustrates process flow chart diagrams of a cyclic plasma processing on a substrate using a plasma comprising a fluorosilane and oxygen in accordance with an embodiment.
Figure 3B:
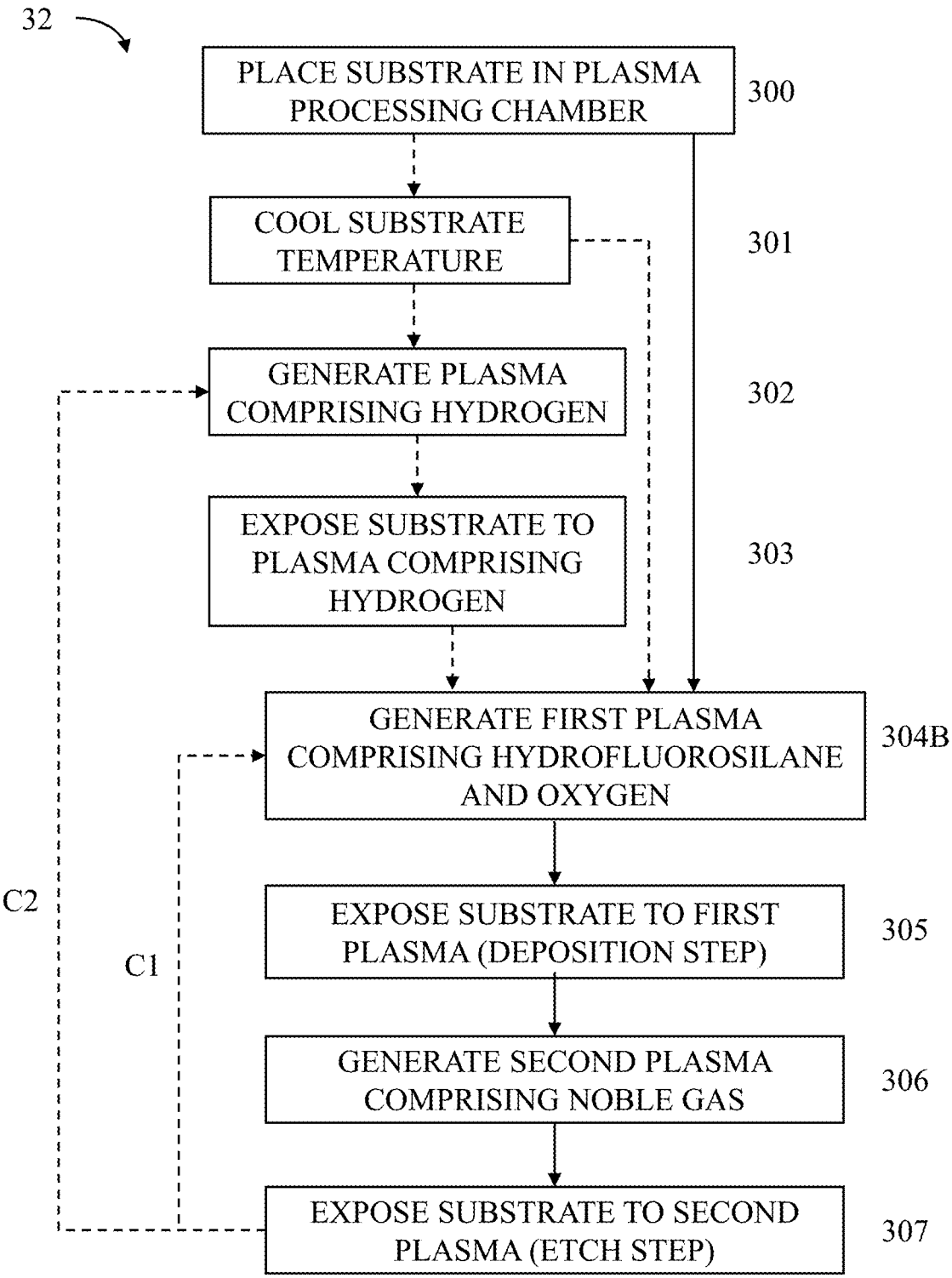
FIG. 3B illustrates process flow chart diagrams of a cyclic plasma processing on a substrate using a plasma comprising a hydrofluorosilane and oxygen in accordance with an alternate embodiment.
Figure 3C:
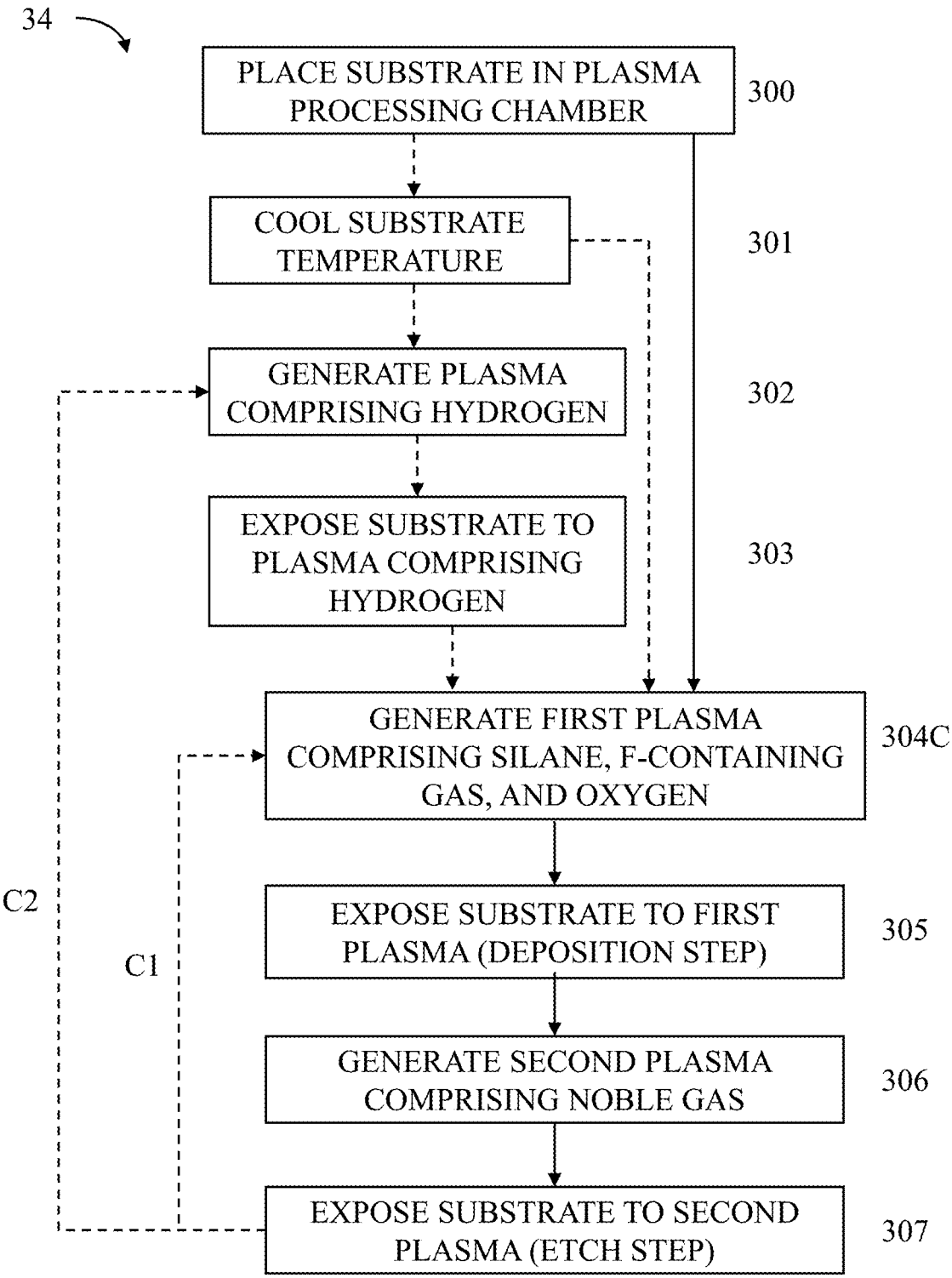
FIG. 3C illustrates process flow chart diagrams of a cyclic plasma processing on a substrate using a plasma comprising a silane, a fluorine-containing gas, and oxygen.
Figure 4A:
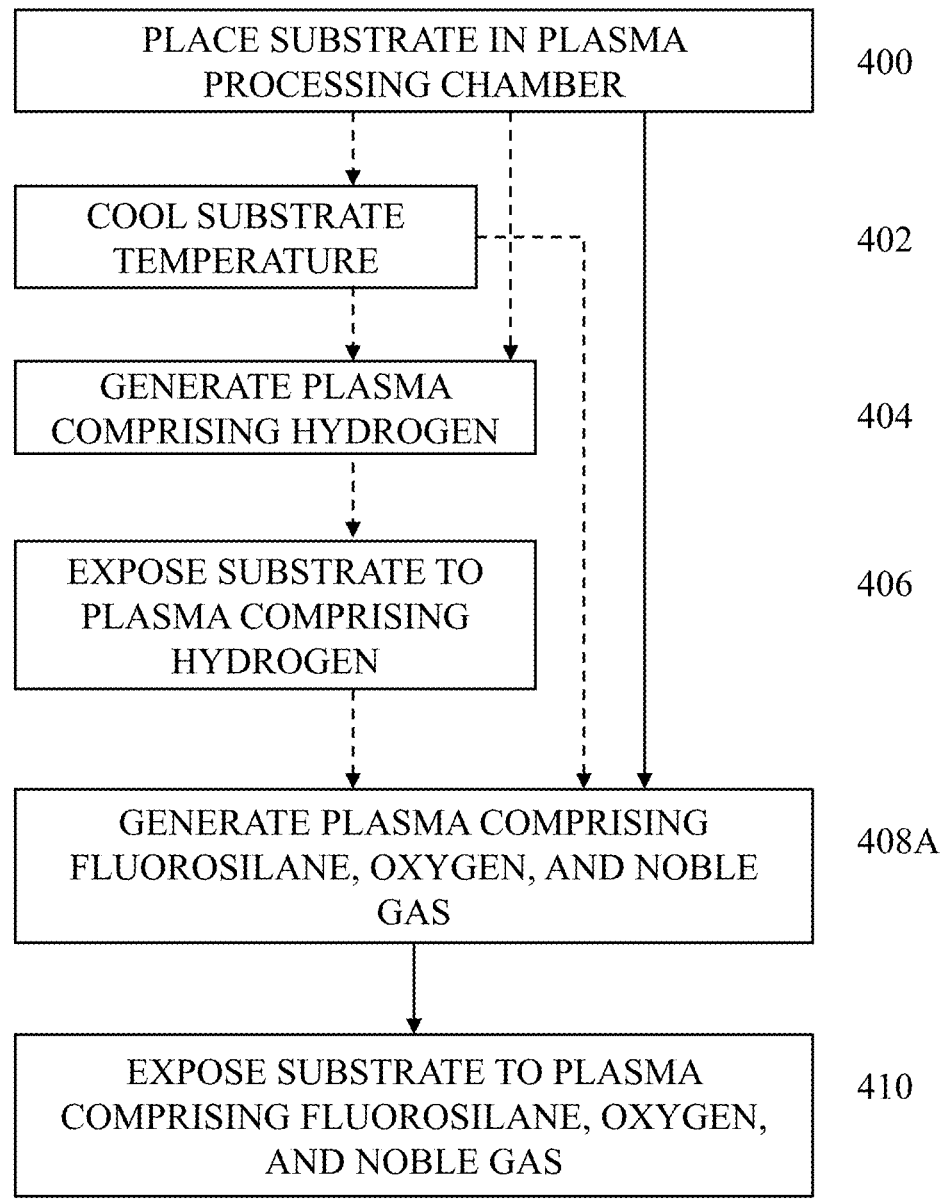
FIG. 4A illustrates a process flow chart diagram of a continuous plasma processing using a plasma comprising a fluorosilane, oxygen, and a noble gas in accordance with an embodiment.
Figure 4B:
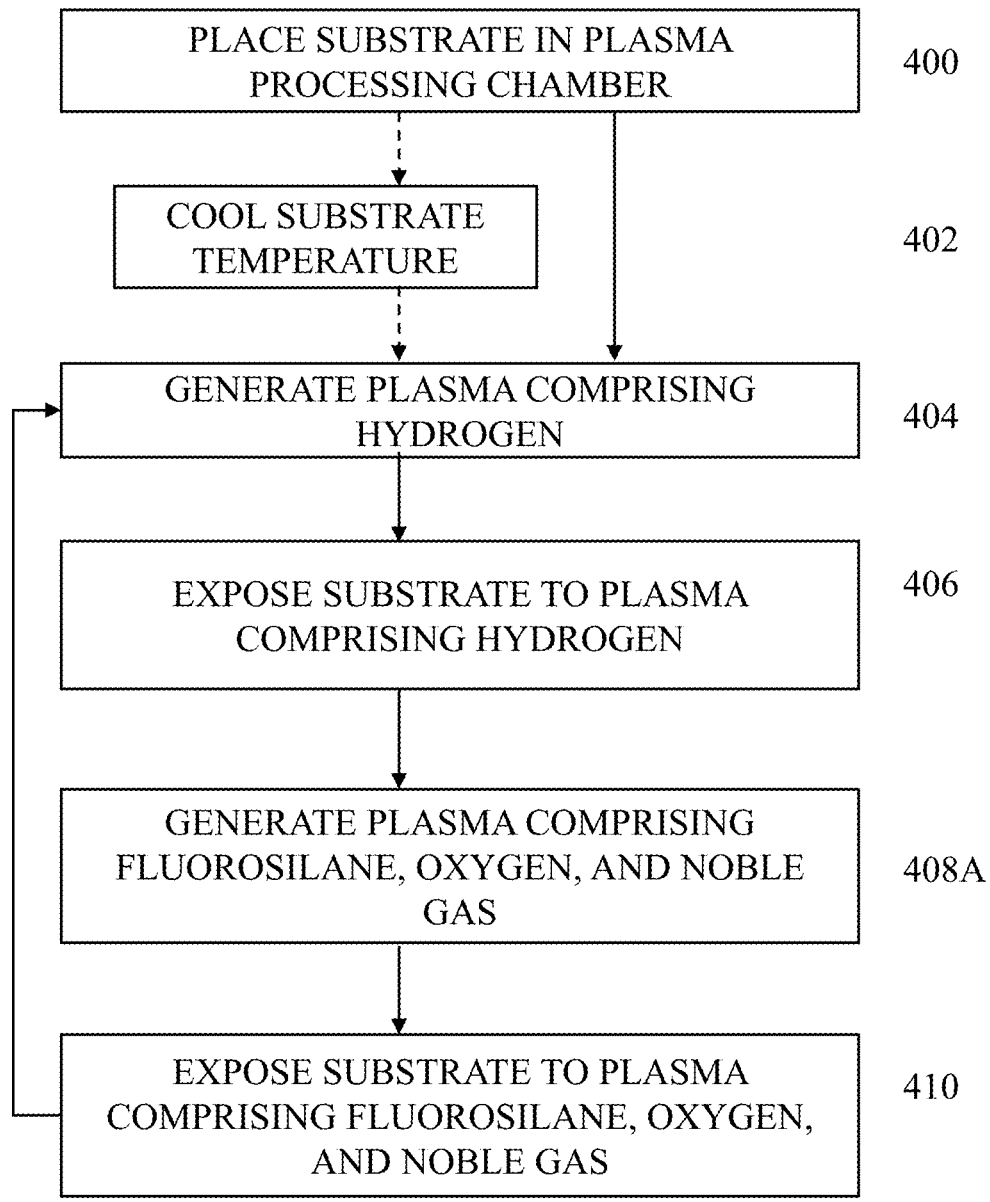
FIG. 4B illustrates a process flow chart diagram of a cyclic plasma processing using a plasma comprising a fluorosilane, oxygen, and a noble gas in accordance with an alternate embodiment.

In the following, FIG. 1A first describe an example plasma system for processing a substrate in accordance with various embodiments. An exemplary scheme of the embodiment methods of plasma processing comprising a deposition step using a first plasma and an etch step using a second plasma is described referring to FIGS. 2A-2F. Two example applications where the embodiment methods may be utilized to selectively etch a nitride are described in FIGS. 2G-2J. A first embodiment of a cyclic plasma processing may be performed using a fluorosilane and oxygen for a first plasma for the deposition step as illustrated in FIG. 3A. The fluorosilane may comprise a hydrofluorosilane in a second embodiment as illustrated in FIG. 3B. In an alternate embodiment, the first plasma may be generated from a gas mixture comprising a silane, fluorine-containing gas, and oxygen as illustrated in FIG. 3C. In further embodiments, the first and second plasmas (i.e., plasmas for deposition and etch) may be simultaneously used in a single step. Combining the plasmas, a continuous plasma processing is enabled as illustrated in FIG. 4A. Further, a cyclic embodiment is also enabled where a hydrogen treatment and the plasma processing using the combined plasma are cyclically repeated as illustrated in FIG. 4B. Other embodiments using a hydrofluorosilane or a silane are described in FIG. 4C. Example data obtained in accordance with one embodiment are presented in FIGS. 5A-5C, 6A-6B, 7, and 8A-8B.

Referring to FIG. 1A, an example plasma processing system 100 comprises a plasma processing chamber 120 connected to a gas delivery system 130 and a vacuum pump system 140. Gases may be introduced into the plasma processing chamber 120 through the gas delivery system 130.

A substrate 110, e.g., a semiconductor wafer to be processed, may be mounted on a substrate holder 164 inside the plasma processing chamber 120. In one or more embodiments, the substrate 110 comprises one or more layers of silicon (Si), silicon oxide ($SiO_2$), or silicon nitride ($Si_3N_4$). The substrate 110 may comprise a semiconductor wafer in some embodiments. The substrate 110 may also comprise any (stoichiometric or not) compounds including oxides and nitrides of Si, Ge, B, W, Al, Ti, Ga, Ta, Hf, or Zr. The substrate 110 may be patterned to include various features.

The substrate holder 164 may be a circular electrostatic chuck. Substrate no may be maintained at a desired process temperature using a cooler 166, e.g., a temperature controller 150 coupled to the cooler 166 and the substrate holder 164.

In the illustrative example in FIG. 1A, substrate holder 164 is connected to a first RF power source 180 and may be a bottom electrode while a top electrode 162 is connected to a second RF power source 160 to power a plasma 170 inside the plasma processing chamber 120. In various embodiments, the top electrode 162 may be a conductive coil located, over a top ceramic window, outside the plasma processing chamber 120.

The configuration of the plasma processing system 100 described above is by example only. In alternative embodiments, various alternative configurations may be used for the plasma processing system 100. For example, inductively coupled plasma (ICP) may be used with RF source power coupled to a planar coil over a top dielectric cover, or capacitively coupled plasma (CCP) generated using a disc-shaped top electrode in the plasma processing chamber 120, the gas inlet and/or the gas outlet may be coupled to the sidewall, etc. Pulsed RF power sources and pulsed DC power sources may also be used in some embodiments (as opposed to continuous wave RF power sources). In various embodiments, the RF power, chamber pressure, substrate temperature, gas flow rates and other plasma process parameters may be selected in accordance with the respective process recipe. In some embodiments, the plasma processing system 100 may be a resonator such as a helical resonator.

Although not described herein, embodiments of the present invention may be also applied to remote plasma systems as well as batch systems. For example, the substrate holder may be able to support a plurality of wafers that are spun around a central axis as they pass through different plasma zones.

The processing of the substrate 110 within the plasma processing system 100 will now be described using FIGS. 2A-2J and 3A-3C. FIGS. 2A-2C illustrate schematic cross-sectional views of a substrate during various steps of a plasma processing in accordance with an embodiment, and FIGS. 2D-2F illustrate another example in accordance with an alternate embodiment. FIGS. 3A-3C illustrate process flow diagrams to perform steps described in FIGS. 2A-2H, and described together below. FIGS. 2G-2J illustrate two example applications for the plasma processing to selectively remove nitride materials during a semiconductor device fabrication.

In FIG. 2A, an incoming substrate 110 to be processed is loaded into the plasma processing chamber 120 in FIG. 1A (see also block 300 in FIGS. 3A-3C). In one embodiment, the substrate 110 comprise a layer of nitride 212 to be etched by a plasma processing by the embodiment method. Similarly, in FIG. 2D, an incoming substrate 110 is illustrated, but comprising a layer of oxide 214 instead of nitride.

To start a deposition step, a first plasma is generated from a first gas mixture comprising a fluorosilane and oxygen (e.g., block 304A in FIG. 3A). In various embodiments, the fluorosilane may comprise tetrafluorosilane ($SiF_4$) so that the first gas mixture comprises tetrafluorosilane ($SiF_4$) and oxygen ($O_2$). In other embodiments, the fluorosilane may comprise a hydrofluorosilane (e.g., block 304B in FIG. 3B). The hydrofluorosilane may have a chemical formula $Si_xH_yF_z$, wherein x≠0, y≠0, and z≠0. For example, the hydrofluorosilane may comprise trifluorosilane ($SiHF_3$), difluorosilane ($SiH_2F_2$), or fluorosilane ($SiH_3F$). Both the fluorosilane and oxygen serve as precursors for a passivation layer 213 comprising silicone oxyfluoride in FIGS. 2B and 2E.

In alternate embodiments, the first gas mixture comprises a silane, a fluorine-containing gas, and oxygen (e.g., block 304C in FIG. 3C). In contrast to the prior embodiments, silicon and fluorine are provided separately from different precursors. By providing silicon and fluorine separately for the first plasma, the chemical composition of the passivation layer (e.g., silicon to fluorine ratio) may advantageously tuned. The silane may have a chemical formula $Si_xH_y$, wherein x≠0 and y≠0. In certain embodiments, the silane may comprise monosilane ($SiH_4$). The fluorine-containing gas may comprise tetrafluoromethane ($CF_4$), difluorine ($F_2$), nitrogen trifluoride ($NF_3$), sulfur hexafluoride ($SF_6$), hexafluoroethane ($C_2F_6$), octafluorocyclobutane ($C_4F_8$), perfluoroisobutene ($C_4F_8$), fluoroform ($CHF_3$), or hydrogen fluoride (HF).

The use of silane compounds containing hydrogen as described above (e.g., hydrofluorosilane or monosilane) may also advantageously provide a hydrogen-containing plasma during the cyclic plasma process, which may be beneficial in improving the etch selectivity. Accordingly, in some embodiments, an optional treatment with the hydrogen-containing plasma to improve an etch selectivity described below may be skipped.

Further, although some of the embodiment methods described above (e.g., FIGS. 3B and 3C) do not dispense tetrafluorosilane ($SiF_4$) into the processing chamber, $SiF_4$ species may advantageously be generated in situ during the process by reaction with the different species within the processing chamber.

The process may be operated at a total gas flow into the plasma processing chamber 120 between 1 sccm and 1000 sccm while maintaining the plasma process chamber pressure between 1 mTorr and 1 atm. One or more inert gases may be added to the first gas mixture as an admixture using any of argon (Ar), helium (He), xenon (Xe), krypton (Kr), or neon (Ne) at any ratio.

In one or more embodiments, a separate, additional treatment with a hydrogen-containing plasma may be performed prior to or during any cycle of the deposition-etch processes. Referring to FIGS. 3A-3C, steps of generating a plasma comprising hydrogen (block 302) and exposing the substrate to the hydrogen-containing plasma (block 303) may be inserted. In one or more embodiments, an additional hydrogen-containing plasma treatment is performed using a gas mixture comprising hydrogen ($H_2$) or hydrogen fluoride (HF), or ammonia ($NH_3$), and Ar, He, nitrogen ($N_2$), or Xe at any ratio. Specifically, any ratio of hydrogen:hydrogen fluoride:ammonia may be used. Optionally, one or more inert gases including argon, helium, nitrogen, or xenon at any ratio may be used. Such additional treatment with the hydrogen containing plasma may advantageously reduce the surface of the substrate, which may improve the selectivity of the deposition step.

In certain embodiments, an additional optional gas comprising hydrogen may be added to the first gas mixture. In other words, the steps described in blocks 302, 303 may be performed together with the step described in block 304A, 304B, or 304C. Such embodiments may advantageously reduce the number of steps of the plasma processing and shorten the process time. A gas mixture comprising hydrogen ($H_2$) or hydrogen fluoride (HF), or ammonia ($NH_3$), and Ar, He, nitrogen ($N_2$), or Xe may be used at any ratio as the additional gas. Specifically, any ratio of hydrogen:hydrogen fluoride:ammonia may be used. Optionally, one or more inert gases including argon, helium, nitrogen, or xenon at any ratio may be used.

To power the first plasma, in one embodiment, a high-frequency (HF) power between 1 W to 10000 W may be applied to the substrate holder 164 and a low-frequency (LF) power between 0 W and 10000 W may be applied to the top electrode 162. Alternately, a high-frequency (HF) power between 1 W to 10000 W may be applied to the top electrode 162 and a low-frequency (LF) power between 0 W and 10000 W may be applied to the substrate holder 164. Additional DC bias may be applied to one or more electrodes.

Referring to FIGS. 2B and 2E, the substrate 110 is exposed to the first plasma (block 305 in FIGS. 3A-3C) resulting in a deposition of a passivation layer 213 on the substrate 110. The passivation layer 213 may comprise silicon oxyfluoride, represented as $SiO_xF_y$. Thickness, composition, and reactivity of $SiO_xF_y$ layer and subsequent etching profile are dependent on the selection of plasma gas composition, substrate material, and process parameters. Accordingly, these characteristics of the passivation layer 213 may be utilized to enable a selective etching process. In one example, as illustrated in FIGS. 2B and 2E, under the same process conditions, the formation of the passivation layer 213 may be preferred over an oxide rather an a nitride. As a result, the passivation layer 213 is significantly thicker over the layer of oxide 214 in FIG. 2E than over the layer of nitride 212 in FIG. 2B. This difference in thickness (i.e., film growth rate) of the passivation layer 213 over different materials may be temperature dependent, and may be maximized at low temperatures, for example at around −65° C. In certain embodiments, process conditions may be optimized so that the formation of the passivation layer 213 may be negligible or absent over a certain material (e.g., silicon nitride). Therefore, the temperature for this step may be tuned to achieve a desired selectivity, for example, for selectively etching silicon nitride over silicon and silicon dioxide as described more in detail below in various embodiments.

In one or more embodiments, the entire process cycle may be performed at a temperature lower or equal to 0° C. for achieving selective plasma etching. In such embodiments, as illustrated in FIGS. 3A-3C, the substrate 110 may be optionally cooled down to a process temperature (block 310) prior to any plasma treatments. The substrate 110 may be cooled using a cooling liquid flowing through a substrate holder 164. In one or more embodiments, deposition step (block 305 in FIGS. 3A-3C) is performed at a low temperature below 0° C., for example, between −120 to 0° C. In other embodiments, the process may be carried out at a temperature between −80 to −50° C.

For an etch step, a second plasma is powered from a second gas mixture comprising a noble gas (block 306 in FIGS. 3A-3C). During the etch step, the substrate 110 is etched by exposing to the second plasma (block 307 in FIGS. 3A-3C) so as to remove all or a portion of the passivation layer 213. In one scenario, a thin passivation layer may be removed quickly and an underlying layer may be etched, while in another scenario, a thick, resistant passivation layer may remain mostly unetched, protecting the underlying later. As described above, the characteristic of the passivation layer 213 (e.g., thickness) depends on the temperature and underlying materials, the etch step may be selective to one material to another due to different characteristics of the passivation layer 213. For example, for the layer of nitride 212 (e.g., silicon nitride) in FIG. 2B, the passivation layer 213 is so thin that it was etched away and the layer of nitride 212 is also completely removed in FIG. 2C. On the other hand, in FIGS. 2E and 2F, the passivation layer 213 formed over the layer of oxide is thick and no substantial etch may occur, or only a portion of the passivation layer 213 may be removed, preserving the underlying later of oxide 214.

In one or more embodiments, an etch step (e.g., block 307 in FIGS. 3A-3C) may be performed at a temperature between −200 to 100° C. In one embodiment, the etch step may be performed at a temperature below 0° C. In further embodiments, the etch step may be performed at about the same temperature as the deposition step. Performing the deposition step and the etch step at different temperatures may be beneficial in utilizing the temperature dependence of each process. On the other hand, performing the two steps at about the same temperature may advantageously minimize or eliminate time required for stabilizing the temperature.

To power the second plasma, in one embodiment, a high-frequency (HF) power between 1 W to 10000 W may be applied to the substrate holder 164 and a low-frequency (LF) power between 0 W and 10000 W may be applied to the top electrode 162. Alternately, a high-frequency (HF) power between 1 W to 10000 W may be applied to the top electrode 162 and a low-frequency (LF) power between 0 W and 10000 W may be applied to the substrate holder 164. Additional DC bias may be applied to one or more electrodes. The plasma process chamber is maintained at a pressure between 1 mTorr and 1 atm.

In one or more embodiments, a plurality of cycles of these steps (blocks 304A-307 in FIG. 2A, blocks 304B-307 in FIG. 2B, and blocks 304C-307 in FIG. 2D) may be performed to achieve a desired etching. This is indicated with a dotted line C1 in FIGS. 3A-3C. The duration of each step may be varied from 0.01 sec to 10 h. Further, at any cycle of the plurality of cycles, the optional treatment with a plasma comprising hydrogen (blocks 302 and 303) described above may also be inserted and included in the cyclic process in certain embodiments, as indicated with a dotted line C2 in FIGS. 3A-3C.

Although not explicitly recited, each of the above steps (blocks 300-307 in FIGS. 3A-3C) may be separated by a purge to remove the gases from the prior step before starting on the next step. For example, a purge between blocks 305 and 306 may be performed to remove the first gas mixture from the plasma processing chamber 120. The purge may be performed by flushing the plasma processing chamber 120 with inert gases, for example.

FIGS. 2G and 2H illustrate schematic cross-sectional views of a substrate 110 before and after an anisotropic plasma processing in accordance with one embodiment used for spacer etch in self-aligned multiple patterning.

Referring to FIGS. 2G and 2H, the selective etch characteristic of the plasma processing described above may be beneficial in various semiconductor device fabrication, for example silicon nitride spacer etch in self-aligned multiple patterning. In FIG. 2G, an incoming substrate 110 may comprise a layer of nitride 212 formed over a patterned layer of oxide 214. In one embodiment, the nitride 212 comprises silicon nitride and is formed as a spacer and the oxide 214 comprises silicon oxide and is formed as a mandrel. A spacer etch is to remove a lateral portion of the spacer material through an anisotropic etch and leaves a vertical portion of the spacer material on sidewalls of a mandrel. As the feature size of semiconductor devices continues to shrink, this is an important yet challenging task. Using the embodiment method of plasma processing, the removal of the lateral portion of nitride 212 without damaging the oxide 214 or the substrate 110 may be enabled as illustrated in FIG. 2H.

FIGS. 2I and 2J illustrate schematic cross-sectional views of a substrate 110 at intermediate stages during a process of forming a 3D vertical NAND (VNAND) structure utilizing an isotropic plasma processing in accordance with another embodiment.

In FIG. 2I, the substrate 110 and a layer stack 216 formed over the substrate 110 are illustrated. The layer stack 216 may comprise alternating layers of nitride 212 and oxide 214. In one embodiments, the alternating layers may comprise silicon nitride and silicon oxide forming a typical 3D VNAND structure. Although the layer stack 216 is shown to include a particular number of layers, it may include as few as two layers of the nitride 212 and the oxide 214 and upwards of one-hundred layers or more. Further, as illustrated in FIG. 2I, a hardmask layer 218 may be formed over the layer stack 216. In FIG. 2I, a channel hole is formed in the middle and filled with a channel material 220 to form the channel of the VNAND memory device being formed. The channel material 114 may include an oxide-nitride-oxide (ONO) memory stack and polysilicon material to form the polysilicon channel. In addition, two slits 222 are formed by etching recesses in the layer stack 216 prior to a plasma processing in accordance with an embodiment.

FIG. 2J illustrates after the plasma processing that selectively removes the nitride 212 within the layer stack 216. The plasma processing may isotropically etch the nitride 212 without damaging the oxide 214 or the substrate 110, thereby forming lateral voids 224 in the layer stack 216. Compared to a conventional wet etch using, for example, a phosphoric acid, the embodiment methods may advantageously etch the nitride 212 more selectively and eliminates the need of a solution-based process. Subsequent process steps may follow conventional techniques for forming a typical 3D VNAND structure, for example, filling the slits 222 and the lateral voids 224 with metal materials comprising, aluminum, titanium, tungsten, or the like.

FIG. 4A illustrates a process flow chart diagram 40 of a continuous plasma processing using a plasma comprising a fluorosilane, oxygen, and a noble gas in accordance with an embodiment, and FIG. 4B illustrates a process flow chart diagram 42 of a cyclic plasma processing using a plasma comprising a fluorosilane, oxygen, and a noble gas in accordance with an alternate embodiment.

The embodiment method illustrated in FIG. 4A combines the deposition and etch steps in the previous embodiments described above, and may be performed as a continuous process. In other embodiments, it may also be performed as a multi-step process such as a cyclic process that includes a hydrogen-containing plasma treatment step as illustrated in FIG. 4B.

In certain embodiments, the plasma etch process may be a continuous process comprising loading a substrate 110 in a plasma processing chamber (block 400), generating a plasma from a gas mixture comprising a fluorosilane, oxygen, and a noble gas (block 408A), and performing an etch step by exposing the substrate to the plasma (block 410). As previously described, the fluorosilane may comprise tetrafluorosilane ($SiF_4$). By combining the two plasma processes (e.g., the deposition step and the etch step illustrated in FIGS. 3A-3C) into a single plasma process (e.g., blocks 408A and 410), the embodiment method may advantageously simplify the process recipe and shorten the process time.

In one or more embodiments, a separate, additional treatment with a hydrogen-containing plasma may be performed. Steps of generating a plasma comprising hydrogen (block 404) and exposing the substrate to the hydrogen-containing plasma (block 406) may be inserted. A gas mixture comprising hydrogen ($H_2$) or hydrofluoric acid (HF), or ammonia ($NH_3$), and Ar, He, nitrogen ($N_2$), or Xe may be used at any ratio. Specifically, any ratio of hydrogen:hydrofluoric acid:ammonia may be used. Optionally, one or more inert gases including argon, helium, nitrogen, or xenon at any ratio may be used.

Referring to FIG. 4B, the etch step and the treatment with the hydrogen-containing plasma above may be cyclically repeated in some embodiments. The cycles may be repeated to achieve a desired level of etching. A cycle of the cyclic plasma process may start with the exposure to the plasma comprising hydrogen (blocks 404 and 406) or the exposure to the plasma containing the fluorosilane (blocks 408A and 410). For the plasmas comprising hydrogen, a gas mixture comprising hydrogen ($H_2$) or hydrogen fluoride (HF), or ammonia ($NH_3$), and Ar, He, nitrogen ($N_2$), or Xe may be used at any ratio. Specifically, any ratio of hydrogen:hydrogen fluoride:ammonia may be used. Optionally, one or more inert gases including argon, helium, nitrogen, or xenon at any ratio may be used.

Figure 4C:
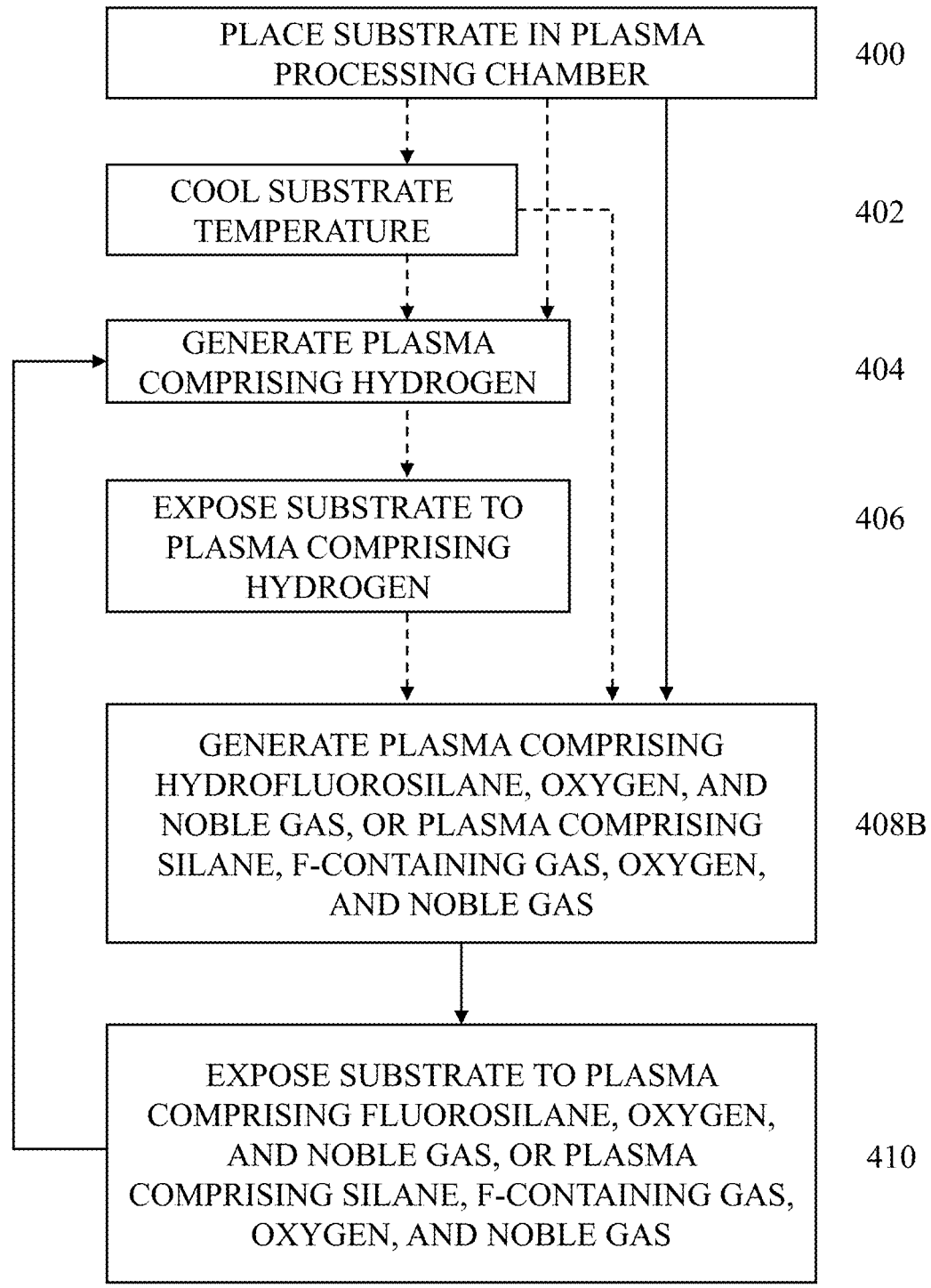
FIG. 4C illustrates a process flow chart diagram of a plasma processing in accordance with another embodiment, wherein a plasma used in the plasma processing comprises a hydrofluorosilane, oxygen, and a noble gas, or wherein the plasma comprises a silane, a fluorine-containing gas, oxygen, and a noble gas.

FIG. 4C illustrates a process flow chart diagram 44 of a plasma processing in accordance with another embodiment, wherein a plasma used in the plasma processing comprises a hydrofluorosilane, oxygen, and a noble gas, or wherein the plasma comprises a silane, a fluorine-containing gas, oxygen, and a noble gas.

In FIG. 4C, a gas combination (block 408B) different from the embodiments of FIG. 4A or 4B may be used but with the same process flow as FIG. 4A or 4B. The plasma processing illustrated in FIG. 4C may be carried out as a continuous process that may be combined with an optional, separate treatment with a hydrogen containing plasma (e.g., FIG. 4A) or a cyclic process that cyclically repeats the etch step and the treatment with the hydrogen-containing plasma (e.g., FIG. 4B). The gas combination may be different in that a hydrofluorosilane or a combination of a silane and a fluorine-containing gas may be used as sources for fluorine and silicon of the plasma. As described above in the prior embodiments, the hydrofluorosilane may have a chemical formula $Si_xH_yF_z$, wherein $x \neq 0$, $y \neq 0$, and $z \neq 0$. For example, the hydrofluorosilane may comprise trifluorosilane ($SiHF_3$), difluorosilane ($SiH_2F_2$), or fluorosilane ($SiH_3F$). The silane may have a chemical formula $Si_xH_y$, wherein $x \neq 0$ and $y \neq 0$. In certain embodiments, the silane may comprise monosilane ($SiH_4$). The fluorine-containing gas may comprise tetrafluoromethane ($CF_4$), difluorine ($F_2$), nitrogen trifluoride ($NF_3$), sulfur hexafluoride ($SF_6$), hexafluoroethane ($C_2F_6$), octafluorocyclobutane ($C_4F_8$), perfluoroisobutene ($C_4F_8$), fluoroform ($CHF_3$), or hydrogen fluoride (HF).

In one or more embodiments, the entire process cycle may be performed optionally at a temperature lower or equal to 0° C. for achieving selective plasma etching. In such embodiments, the substrate 110 is cooled down to a process temperature (block 202) prior to any plasma treatments. In one or more embodiments, the cyclic plasma process is performed at a temperature between −120 to 0° C. In other embodiments, the cyclic plasma process may be carried out at a temperature between −80 to −50° C.

In one or more embodiments, the cyclic plasma process may be carried out using a gas mixture of $SiF_4$, $O_2$, and a noble gas at any mixture ratio. The noble gas may be Ar, He, Xe, Kr, or Ne. These gases may be used in any combination at any ratio. The process may be operated at a total gas flow into the plasma processing chamber 120 between 1 sccm and 1000 sccm while maintaining the pressure inside the plasma process chamber 120 to be between 1 mTorr and 1 atm. One or more inert gases may be added to the flow as an admixture using Ar, He, Xe, Kr, or Ne at any ratio. To power the plasma, in one embodiment, a high-frequency (HF) power between 1 W to 10000 W may be applied to the substrate holder 164 and a low-frequency (LF) power between 0 W and 10000 W may be applied to the top electrode 162. Alternately, a high-frequency (HF) power between 1 W to 10000 W may be applied to the top electrode 162 and a low-frequency (LF) power between 0 W and 10000 W may be applied to the substrate holder 164. Additional DC bias may be applied to one or more electrodes. The process duration for any step may be varied from 0.01 sec to 10 h.

In certain embodiments, an additional gas comprising hydrogen may be added to the first gas mixture of $SiF_4$, $O_2$, and a noble gas. In other words, the steps described in blocks 204, 206 may be performed together with the step described in block 208. A gas mixture comprising hydrogen ($H_2$) or hydrogen fluoride (HF), or ammonia ($NH_3$), and Ar, He, and nitrogen ($N_2$), or Xe may be used at any ratio. Specifically, any ratio of hydrogen:hydrogen fluoride:ammonia may be used. Optionally, one or more inert gases including argon, helium, nitrogen, or xenon at any ratio may be used.

Although not explicitly recited, each of the above steps 200-210 may be separated by a purge to remove the gases from the prior step before starting on the next step.

Figure 5A:
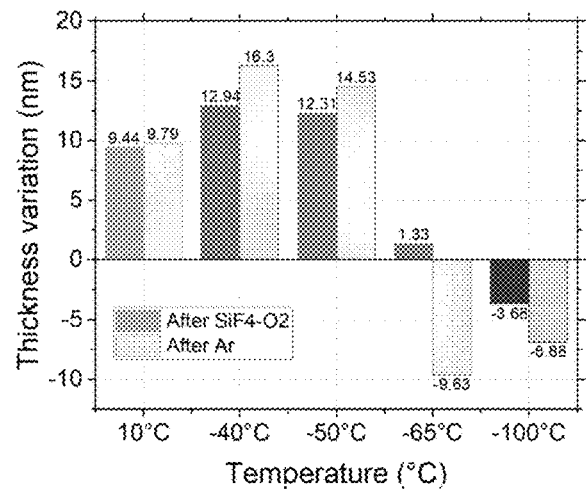
Figure 5B:
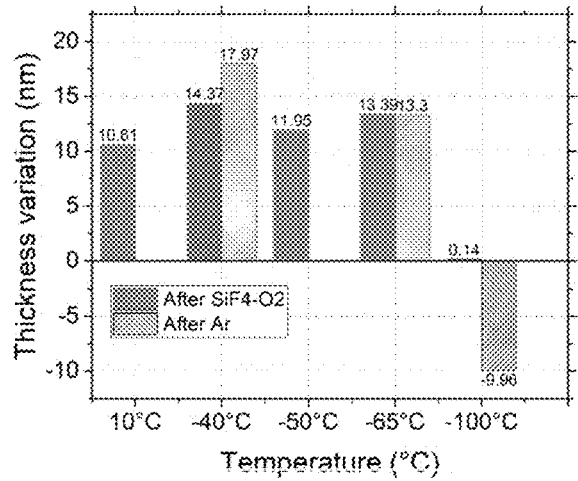
Figure 5C:
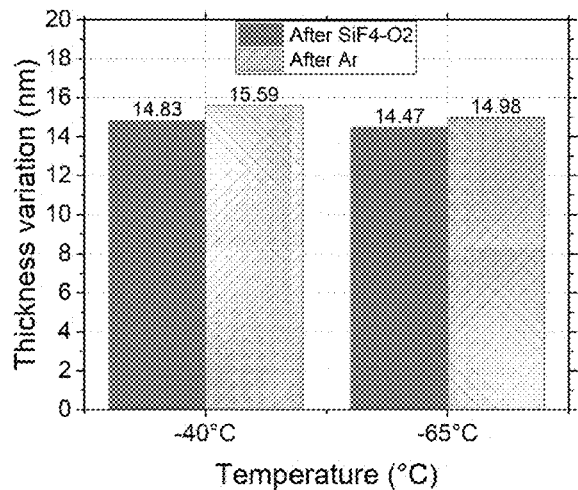

FIGS. 5A-5C illustrate example experimental data of thickness variations of three different substrates after a plasma processing in accordance with an embodiment. The substrate comprises (a) a silicon nitride layer, (b) amorphous Si (a-Si) layer, or (c) a silicon dioxide layer. The thickness variation is a measure of the difference in thickness of the layer before and after the plasma processing. For example, the thickness of a silicon nitride layer before and after the plasma processing can be measured and compared to calculate a thickness variation.

FIG. 5A illustrates experimental data of thickness variation of a substrate comprising a silicon nitride layer, FIG. 5B illustrates experimental data of thickness variation of a substrate comprising an amorphous silicon layer, and FIG. 5C illustrates experimental data of thickness variation of a substrate comprising a silicon dioxide layer.

For each process temperature, two data points are provided: (1) the thickness variation after a deposition step with $SiF_4/O_2$ plasma and (2) the thickness variation after the first step and a subsequent etch step with Ar plasma. During the deposition step, a thin passivation film of $SiO_xF_y$ is formed on all three substrates, typically with a thickness between 9-15 nm. However, it is evident that the thickness of the deposited film is dependent on substrate material, process temperature, and other process parameters.

Notably, on the substrate comprising a silicon nitride layer (FIG. 5A) and the substrate comprising the amorphous silicon layer (FIG. 5B), at temperatures below a threshold, $SiO_xF_y$ formation is minimized or does not occur. For example, only a thickness of 1.33 nm is observed on the substrate comprising the silicon nitride layer at −65° C. and 0.14 nm on the substrate comprising the amorphous silicon layer at −100° C. The threshold temperature for such a transition of film thickness is found higher for the substrate comprising the silicon nitride layer (about −65° C.) than the substrate comprising the amorphous silicon layer (about −100° C.).

When the substrate is next exposed to an Ar plasma at the same process temperature, the $SiO_xF_y$ layer formed in the previous deposition step may function as a passivation layer, and the substrate thickness is not substantially changed at temperatures higher than a threshold regardless of materials as illustrated in FIGS. 5A-5C. In some instances, there may even be a slight increase in thickness (e.g., at −40° C. in FIG. 5A) However, at temperatures below the threshold, presumably due to insufficient passivation, the process enters an etching regime to remove materials. In the case of a substrate comprising the silicon nitride layer (FIG. 5A), successful etching occurs at −65° C. or below. In the case of a substrate comprising the amorphous silicon layer (FIG. 5B), because the threshold temperature is lower than silicon nitride as described above, etching starts to occur only below −100° C., while no substantial thickness variation is observed at −65° C.

Similarly, no etching occurs at −65° C. on silicon dioxide even after the Ar plasma treatment as illustrated in FIG. 5C.

Referring to FIGS. 5A-5C, this example highlights the effect of temperature in ALE process to enable selective etching of material, in particular, nitride over pure element or oxide. A similar experiment may be performed to optimize and identify the temperature thresholds for other material systems.

Next, FIGS. 6A-6B along with FIGS. 7, 8A-8B will be described to schematically understand the underlying mechanism for the observed improvements. Such an understanding may help to apply embodiments of the present invention to other material systems without undue experimentation. Applicant disclosed processes are, however, not restricted in any way because of the mechanisms discussed herein. This discussion is not meant to be the only mechanism and further research may help to understand the further underlying mechanisms or alternate mechanisms.

Figure 6A:
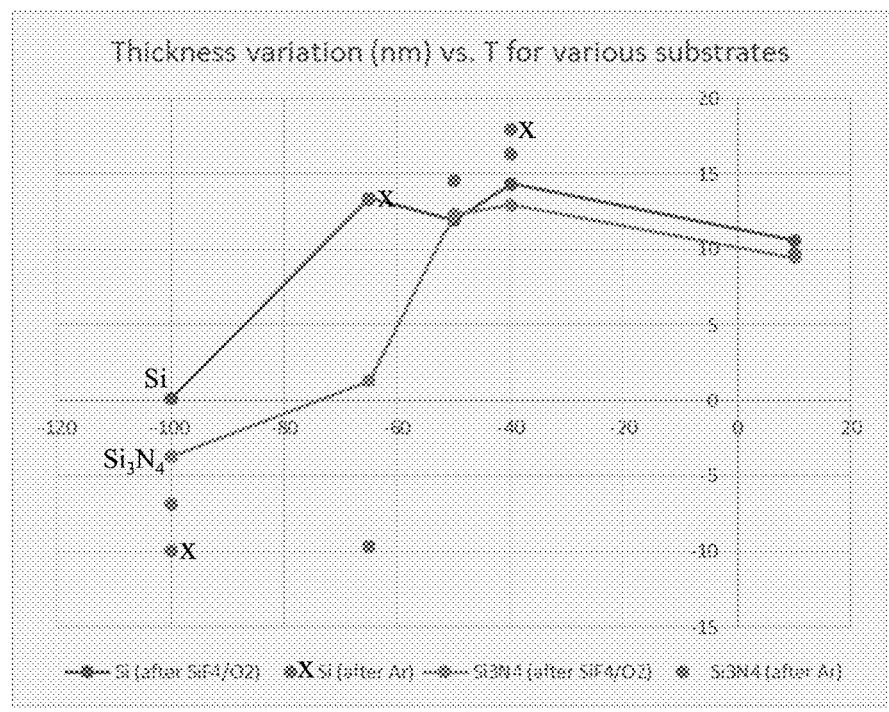

FIG. 6A is a plot of the data provided in FIGS. 5A and 5B to further illustrate the emergence of etching regime as lowering the temperature but after different threshold temperatures for $Si_3N_4$ and a-Si. Markers with line represent the data after the first $SiF_4/O_2$ plasma step (deposition) and dots represent those after the subsequent Ar plasma step (etch). Etching regime is found at temperatures low enough when the first deposition step does not result in $SiO_xF_y$ formation with a thickness of more than a few nm.

Figure 6B:
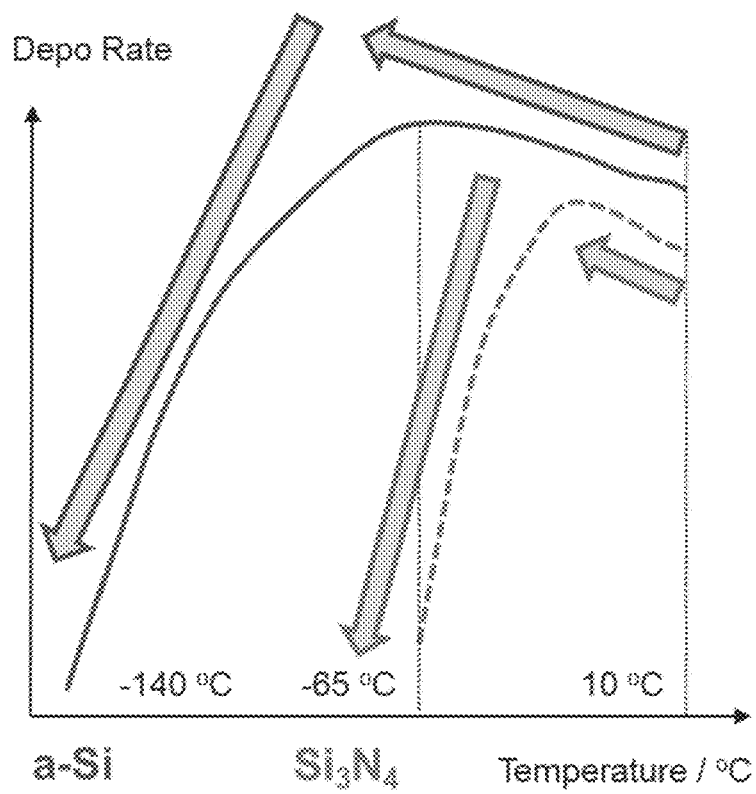

Schematically, this transition is presented as a change in deposition rate as a function of process temperature in FIG. 6B. The deposition rate decreased as the process temperature is lowered for both substrates. Such a transition occurs at a higher temperature for a substrate comprising a silicon nitride layer (labeled $Si_3N_4$) than a substrate comprising an amorphous silicon layer (labeled a-Si). In addition, the deposition rates show an inflexion point with temperature, in other words, deposition rate increase and then decreases as lowering the temperature. This trend suggests that there are likely to be competing driving forces, which opens more potential for future optimizations.

Figure 7:
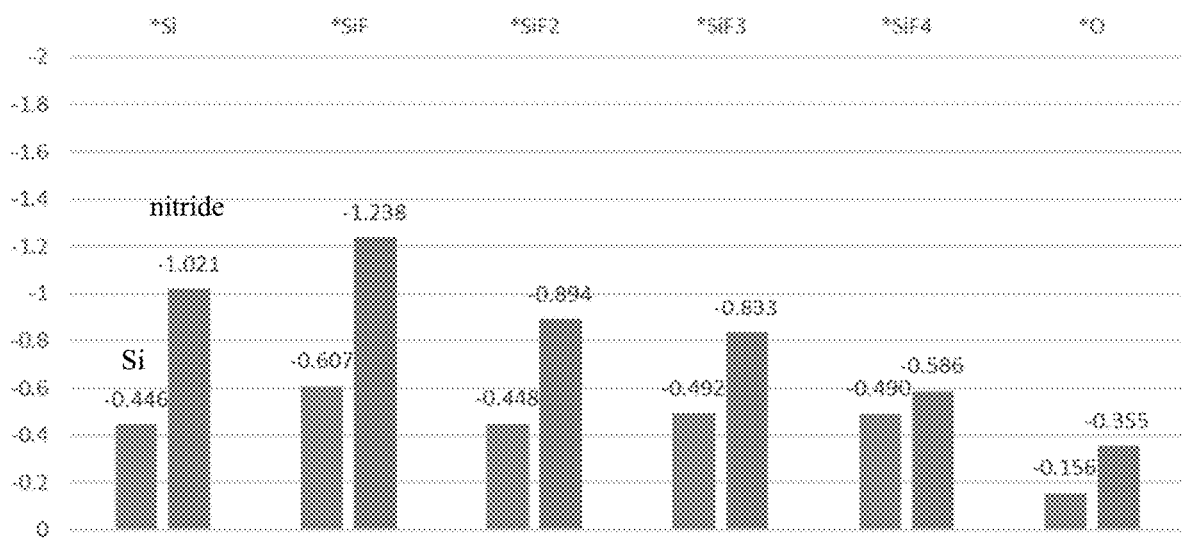
FIG. 7 illustrates, in accordance with an embodiment, energy of adsorption for a silicon radical, tetrafluorosilane radical species, and an oxygen radical on silicon and silicon nitride surfaces obtained from a density-functional theory (DFT) calculation.

FIG. 7 is a series of calculated energy of adsorption ($E_{ad}$) for a silicon radical, fluorosilane radical species, and an oxygen radical on Si and $Si_3N_4$ surfaces obtained from a density-functional theory (DFT) simulation. For example, this energy indicates the difference in energy of a system in which a silicon radical is at infinity relative to a substrate comprising a silicon layer with a system in which the silicon radical is placed on the surface of the substrate comprising the silicon layer. This analysis may shed some light on the possible mechanism that underlies the observed difference in the deposition of $SiO_xF_y$ on Si and $Si_3N_4$.

Referring to FIG. 7, first, across the series, Si and SiF radical species generally have higher $E_{ad}$ than oxygen radical. This should result in a greater enhancement of physisorption of $SiF_x$ species than an oxygen radical when lowering the process temperature, and thereby leading to higher surface concentration of $SiF_x$ species at lower temperatures. This may explain the initial increase of deposition rate for $SiO_xF_y$ shown in FIG. 6B at a range between 10° C. and −40° C.

On the other hand, as the temperature further decreases, while surface concentration of $SiF_x$ species may be even higher, such a high concentration may suppress the change of $SiF_x$ species to form dangling bonds with surface atoms, and thereby inhibiting the deposition. Consequently, the balance shifts from deposition to etching in the first step, which may explain the loss of $SiO_xF_y$ layer formation with a threshold temperature of about −65° C. for $Si_3N_4$ and −100° C. for a-Si.

Second, as illustrated in FIG. 7, adsorption energy ($E_{ad}$) is higher on $Si_3N_4$ than a-Si across the series. This may be at least a part of the reason behind the higher threshold temperature for $Si_3N_4$.

Furthermore, other possible mechanism to cause the difference of $SiO_xF_y$ layer formation between substrates in the deposition step may also be considered in addition to those described above.

Figure 8A:
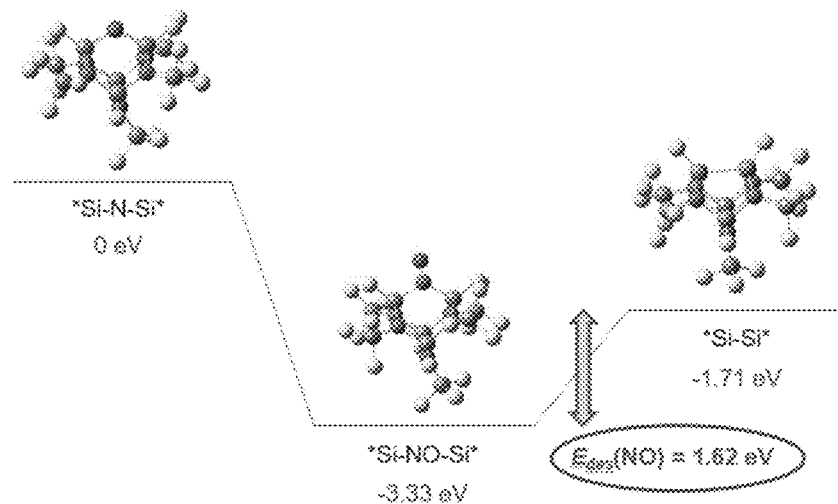
Figure 8B:
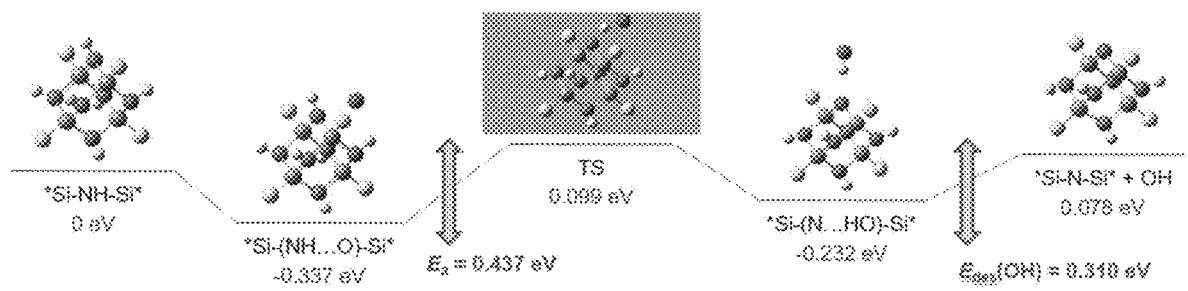

FIGS. 8A and 8B illustrate surface energies of different complexes as calculated using density functional theory.

Referring to FIG. 8A, a —Si—N—Si— surface can adsorb an oxygen radical to form a —Si—NO—Si— surface while lowering its energy by −3.33 eV. This reaction pathway is very favorable because of the lower energy state of the —Si—NO—Si— surface that is formed. Subsequently, a NO radical can desorb from the —Si—NO—Si— surface to form a —Si—Si— surface at a relatively low desorption energy of 1.62 eV. Because of the low energy of NO radicals to be desorbed, low energy ions can successful knock off the NO radicals from the —Si—NO—Si— surface. In other words, a substrate comprising a silicon nitride layer can consume oxygen radicals, which can reduce the oxygen concentration in the SiOxFy being formed over the silicon nitride layer. A fluorinated silicon nitride model was used for the calculation to mimic the etch front of $Si_3N_4$.

In addition, if hydrogen is present on surface of a substrate, it may also play a role in interaction with oxygen radicals. As a residual impurity in a silicon nitride layer or a result of possible hydrogen-containing plasma treatment described in this disclosure, there may be NH groups present in the silicon nitride layer that may participate in a deposition mechanism.

For example, FIG. 8B presents oxygen radical consumption via OH bond formation, with reasonable low activation energy for a transition state and desorption energy for OH. A *Si—NH—Si* surface can adsorb an oxygen radical and lower its energy by −0.337 eV and subsequently release an O—H group through a transition state with a low barrier. Because of this, the *N—H groups in the silicon nitride may scavenge oxygen by forming O—H bonds.

Example embodiments of the invention are summarized here. Other embodiments can also be understood from the entirety of the specification as well as the claims filed herein.

Example 1. A method for processing a substrate that includes: loading the substrate in a plasma processing chamber; performing a cyclic plasma etch process including a plurality of cycles, where each cycle of the plurality of cycles includes: generating a first plasma from a first gas mixture including a fluorosilane and oxygen; performing a deposition step by exposing the substrate to the first plasma to form a passivation film including silicon and fluorine; generating a second plasma from a second gas mixture including a noble gas; and performing an etch step by exposing the substrate to the second plasma.

Example 2. The method of example 1, further including maintaining the substrate at a temperature between −120° C. and 0° C. during the cyclic plasma etch process.

Example 3. The method of one of examples 1 or 2, further including: exposing the substrate to a hydrogen containing plasma prior to performing the cyclic plasma etch process.

Example 4. The method of one of examples 1 to 3, where each cycle of the plurality of cycles further includes exposing the substrate to a hydrogen containing plasma.

Example 5. The method of one of examples 1 to 4, where the first gas mixture further includes a hydrogen-containing gas so that exposing the substrate to the first plasma also exposes the substrate to a hydrogen containing plasma.

Example 6. The method of one of examples 1 to 5, where the substrate includes a first exposed surface including silicon nitride, a second exposed surface including silicon dioxide, and a third exposed surface including silicon, where, during the cyclic plasma etch process, the first exposed surface is selectively etched relative to the second and third exposed surfaces.

Example 7. The method of one of examples 1 to 6, where the fluorosilane includes silicon tetrafluoride (SiF4).

Example 8. The method of one of examples 1 to 7, where the fluorosilane includes a hydrofluorosilane.

Example 9. The method of one of examples 1 to 8, where the hydrofluorosilane includes trifluorosilane (SiHF3), difluorosilane (SiH2F2), or fluorosilane (SiH3F).

Example 10. A method for processing a substrate that includes: having a substrate including a first region, a second region, and a third region, the first region including a nitride of a first element, the second region including an oxide of the first element, and the third region including an elemental form of the first element; and selectively etching the first region relative to the second and third regions by using a multiple step plasma process in a plasma process chamber, the multiple step plasma process including: while maintaining the substrate at a first temperature, exposing the substrate to a first plasma generated from a first gas mixture including a silane, a fluorine-containing gas, and oxygen, the first temperature being lower or equal to 0° C.; and while maintaining the substrate at a second temperature, exposing the substrate to a second plasma generated from a second gas mixture including a noble gas.

Example 11. The method of example 10, where the first temperature is lower than the second temperature.

Example 12. The method of one of examples 10 or 11, where the first temperature is between −120° C. and 0° C., and where the second temperature is between −200° C. and 100° C.

Example 13. The method of one of examples 10 to 12, where the silane includes monosilane (SiH4), and the fluorine-containing gas includes tetrafluoromethane (CF4), difluorine (F2), nitrogen trifluoride (NF3), sulfur hexafluoride (SF6), hexafluoroethane (C2F6), octafluorocyclobutane (C4F8), perfluoroisobutene (C4F8) fluoroform (CHF3), or hydrogen fluoride (HF).

Example 14. The method of one of examples 10 to 13, where the first element includes Si, Ge, B, W, Al, Ti, Ga, Ta, Hf, or Zr.

Example 15. The method of one of examples 10 to 14, further including: exposing the substrate to a hydrogen containing plasma before selectively etching the third region.

Example 16. The method of one of examples 10 to 15, where the first gas mixture further includes a hydrogen-containing gas so that exposing the substrate to the first plasma also exposes the substrate to a hydrogen containing plasma.

Example 17. A method for processing a substrate that includes: having a substrate including a first region, a second region, and a third region, the first region including a nitride of a first element, the second region including an oxide of the first element, and the third region including an elemental form of the first element; and selectively etching the first region relative to the second and third regions by using a plasma process including: while maintaining the substrate at a first temperature, exposing the substrate to a plasma generated from a gas mixture including silicon, fluorine, oxygen, and a noble gas, the first temperature being lower or equal to 0° C.

Example 18. The method of example 17, where the plasma process is a continuous plasma process, and where the silicon and the fluorine in the gas mixture is a part of a fluorosilane.

Example 19. The method of one of example 17, where the plasma process is a cyclic plasma process including a plurality of cycles in a plasma process chamber, each cycle of the plurality of cycles including the exposing to the plasma generated from the gas mixture and further exposing the substrate to a hydrogen containing plasma, and where the silicon and the fluorine in the gas mixture is a part of a fluorosilane.

Example 20. The method of one of example 17, where the silicon in the gas mixture is a part of a hydrofluorosilane or a silane.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
    loading the substrate in a plasma processing chamber;
    performing a cyclic plasma etch process comprising a plurality of cycles, wherein the substrate is maintained at a temperature between −120° C. and 0° C. during the cyclic plasma etch process, and wherein each cycle of the plurality of cycles comprises:
        generating a first plasma from a first gas mixture comprising a fluorosilane and oxygen;
        performing a deposition step by exposing the substrate to the first plasma to form a passivation film comprising silicon and fluorine;
        generating a second plasma from a second gas mixture comprising a noble gas; and
        performing an etch step by exposing the substrate to the second plasma.

2. The method of claim 1, further comprising:
    exposing the substrate to a hydrogen containing plasma prior to performing the cyclic plasma etch process.

3. The method of claim 1, wherein each cycle of the plurality of cycles further comprises exposing the substrate to a hydrogen containing plasma.

4. The method of claim 1, wherein the first gas mixture further comprises a hydrogen-containing gas so that exposing the substrate to the first plasma also exposes the substrate to a hydrogen containing plasma.

5. The method of claim 1, wherein the substrate comprises a first exposed surface comprising silicon nitride, a second exposed surface comprising silicon dioxide, and a third exposed surface comprising silicon, wherein, during the cyclic plasma etch process, the first exposed surface is selectively etched relative to the second and third exposed surfaces.

6. The method of claim 1, wherein the fluorosilane comprises silicon tetrafluoride (SiF$_4$).

7. The method of claim 1, wherein the fluorosilane comprises a hydrofluorosilane.

8. The method of claim 7, wherein the hydrofluorosilane comprises trifluorosilane (SiHF$_3$), difluorosilane (SiH$_2$F$_2$), or fluorosilane (SiH$_3$F).

9. A method for processing a substrate, the method comprising:
    having a substrate comprising a first region, a second region, and a third region, the first region comprising a nitride of a first element, the second region comprising an oxide of the first element, and the third region comprising an elemental form of the first element; and
    selectively etching the first region relative to the second and third regions by using a multiple step plasma process in a plasma process chamber, the multiple step plasma process comprising:
        while maintaining the substrate at a first temperature, exposing the substrate to a first plasma generated from a first gas mixture comprising a silane, a fluorine-containing gas, and oxygen, the first temperature being lower or equal to 0° C.; and while maintaining the substrate at a second temperature, exposing the substrate to a second plasma generated from a second gas mixture comprising a noble gas.

10. The method of claim 9, wherein the first temperature is lower than the second temperature.

11. The method of claim 9, wherein the first temperature is between −120° C. and 0° C., and wherein the second temperature is between −200° C. and 100° C.

12. The method of claim 9, wherein the silane comprises monosilane ($SiH_4$), and the fluorine-containing gas comprises tetrafluoromethane ($CF_4$), difluorine ($F_2$), nitrogen trifluoride ($NF_3$), sulfur hexafluoride ($SF_6$), hexafluoroethane ($C_2F_6$), octafluorocyclobutane ($C_4F_8$), perfluoroisobutene ($C_4F_8$) fluoroform ($CHF_3$), or hydrogen fluoride (HF).

13. The method of claim 9, wherein the first element comprises Si, Ge, B, W, Al, Ti, Ga, Ta, Hf, or Zr.

14. The method of claim 9, further comprising:

exposing the substrate to a hydrogen containing plasma; and selectively etching the third region.

15. The method of claim 9, wherein the first gas mixture further comprises a hydrogen-containing gas so that exposing the substrate to the first plasma also exposes the substrate to a hydrogen containing plasma.

16. A method for processing a substrate, the method comprising:

having a substrate comprising a first region, a second region, and a third region, the first region comprising a nitride of a first element, the second region comprising an oxide of the first element, and the third region comprising an elemental form of the first element; and selectively etching the first region relative to the second and third regions by using a plasma process comprising:

while maintaining the substrate at a first temperature, exposing the substrate to a plasma generated from a gas mixture comprising silicon, fluorine, oxygen, and a noble gas, the first temperature being lower or equal to 0° C.

17. The method of claim 16, wherein the plasma process is a continuous plasma process, and wherein the silicon and the fluorine in the gas mixture is a part of a fluorosilane.

18. The method of claim 16, wherein the plasma process is a cyclic plasma process comprising a plurality of cycles in a plasma process chamber, each cycle of the plurality of cycles comprising the exposing to the plasma generated from the gas mixture and further exposing the substrate to a hydrogen containing plasma, and wherein the silicon and the fluorine in the gas mixture is a part of a fluorosilane.

19. The method of claim 16, wherein the silicon in the gas mixture is a part of a hydrofluorosilane or a silane.

20. The method of claim 16, wherein the first element comprises Si, Ge, B, W, Al, Ti, Ga, Ta, Hf, or Zr.

* * * * *